US007087920B1

(12) United States Patent
Kamins

(10) Patent No.: US 7,087,920 B1
(45) Date of Patent: Aug. 8, 2006

(54) NANOWIRE, CIRCUIT INCORPORATING NANOWIRE, AND METHODS OF SELECTING CONDUCTANCE OF THE NANOWIRE AND CONFIGURING THE CIRCUIT

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/038,644

(22) Filed: Jan. 21, 2005

(51) Int. Cl.
*H01L 29/02* (2006.01)
(52) U.S. Cl. .................. 257/2; 257/E29.07; 977/938; 977/943; 977/762
(58) Field of Classification Search .................. 257/2, 257/419, 467, 470, 607, 608, E29.07, E29.071, 257/E29.302; 977/762, 938, 943
See application file for complete search history.

(56) References Cited

OTHER PUBLICATIONS

Chiu, P.W.; Gu, G.; Kim, G.T.; Philipp, G.; Roth, S.; Yang, S.F.; Yang, S., Temperature-induced change from p to n conduction in metallofullerene nanotube peapods, Dec. 3, 2001, American Institute of Physics, Applied Physics Letters vol. 79, No. 23, p. 3845-7.*

M. Saif Islam et al., Ultrahigh-density silicon nanobridges formed between two vertical silicon surfaces, Nanotechnology 15, 2004 IOP Publishing Ltd., pp. L5-L8.
J.F. Nutzel et al., Segregation and difusion on semiconductor surfaces, Physical Review B, May 15, 1996-II, The American Physical Society, vol. 53, No. 20, pp. 13 551-13 558.

* cited by examiner

*Primary Examiner*—Minhloan Tran
*Assistant Examiner*—Benjamin Tzu-Hung Liu

(57) ABSTRACT

A nanowire includes a single crystalline semiconductor material having an exterior surface and an interior region and at least one dopant atom. At least a portion of the nanowire thermally switches between two conductance states; a high conductance state, where a high fraction of the dopant atoms is in the interior region, and a low conductance state, where a lower fraction of the dopant atoms is at the interior region and a higher fraction of the atoms is at the exterior surface. A method to select the conductance of the nanowire increases a temperature of the nanowire at least in a local region to a programming temperature to thermally activate diffusion of a dopant atom into a bulk region of the single crystalline semiconductor material and decreases the temperature of the nanowire at least in the local region to a second temperature to immobilize dopant atoms in the bulk region, the second temperature being below the programming temperature, wherein immobilized dopant atoms in the bulk region produce a desired high or low conductance state in the nanowire. The method can be used to initially configure and to reconfigure a circuit incorporating the nanowire.

26 Claims, 9 Drawing Sheets

NANOWIRE, CIRCUIT INCORPORATING NANOWIRE, AND METHODS OF SELECTING CONDUCTANCE OF THE NANOWIRE AND CONFIGURING THE CIRCUIT

BACKGROUND

1. Field

The present disclosure relates to nanostructures and programmable electronic devices incorporating nanostructures, e.g., nanoelectronic devices incorporated into a circuit.

2. Background Information

"Top-down" approaches to increasing electronic device density are known. An alternative "bottom-up" technological approach uses functional nano-structures assembled from chemically synthesized, nano-scale building blocks. Wide-scale integration of functional nano-scale devices involves connecting nanoscale electrically conducting wires to microscale electrodes. One approach to address this connectivity issue is the simultaneous lateral growth of a high density of highly oriented, metal catalyzed silicon nanowires on a patterned substrate where the nanowires are between two vertical sidewalls.

Known attempts to program the conductivity of a device element have used charge storage in an isolated region to control the conduction in a nearby semiconducting region (EEPROM or Flash memory) or have changed the structure of the material between two states, such as amorphous and crystalline, with each state having a different conductivity. The EEPROM involves fabrication of a double-gated structure and uses high voltage for programming; supplying these voltages externally can involve additional power supplies. Generating the voltages on-chip from lower supply voltages can involve substantial additional circuitry; in addition these memories can be difficult to scale to nanoscale dimensions. Phase-change materials can involve complex combinations of elements, some of which may be toxic, and control of the composition can be difficult.

SUMMARY

An exemplary embodiment of a nanowire comprises a single crystalline semiconductor material having an exterior surface and an interior region, and one or more dopant atoms. At least a portion of the nanowire thermally switches between two conductance states, the two conductance states being a high conductance state and a low conductance state. In the high conductance state, a first fraction of the dopant atoms are in the interior region and a second fraction of the dopant atoms are at the exterior surface. In the low conductance state, a third fraction of the dopant atoms are in the interior region and a fourth fraction of the dopant atoms are at the exterior surface. The first fraction is greater than the third fraction and the second fraction is less than the fourth fraction.

An exemplary embodiment of a circuit comprises a nanowire electrically connected between two electrical contact points within the circuit, the nanowire including a single crystalline semiconductor material having an exterior surface and an interior region, means for raising and lowering a temperature of at least a portion of the nanowire to switch at least the portion of the nanowire between two conductance states, the two conductance states being a high conductance state and a low conductance state, and a plurality of dopant atoms. In the high conductance state, a first fraction of the dopant atoms are in the interior region and a second fraction of the dopant atoms are at the exterior surface. In the low conductance state, a third fraction of the dopant atoms are in the interior region and a fourth fraction of the dopant atoms are at the exterior surface. The first fraction is greater than the third fraction and the second fraction is less than the fourth fraction.

An exemplary method to select the conductance of a nanowire formed of a single crystalline semiconductor material comprises increasing a temperature of the nanowire at least in a local region to a programming temperature to thermally activate diffusion of dopant atoms in the local region, and decreasing the temperature of the nanowire at least in the local region to a second temperature to immobilize dopant atoms in the local region, the second temperature being below the programming temperature. Increasing the temperature and decreasing the temperature thermally switches the nanowire between two conductance states, the two conductance states including a high conductance state and a low conductance state. In the high conductance state, a first fraction of the dopant atoms are in an interior portion of the local region and a second fraction of the dopant atoms are at an exterior surface of the local region. In the low conductance state, a third fraction of the dopant atoms are in the interior portion of the local region and a fourth fraction of the dopant atoms are at the exterior surface of the local region. The first fraction is greater than the third fraction and the second fraction is less than the fourth fraction.

An exemplary method to configure a circuit comprising a plurality of electrical paths formed of nanowires comprises selecting a first conductance of one or more nanowires in a first electrical path of the circuit, and changing the first conductance of the one or more nanowires in the first electrical path. The nanowires comprise a single crystalline semiconductor material having an exterior surface and an interior region, and one or more dopant atoms. The first conductance is one of a high conductance state and a low conductance state. In the high conductance state, a first fraction of the dopant atoms are in the interior region and a second fraction of the dopant atoms are at the exterior surface. In the low conductance state, a third fraction of the dopant atoms are in the interior region and a fourth fraction of the dopant atoms are at the exterior surface. The first fraction is greater than the third fraction and the second fraction is less than the fourth fraction.

BRIEF DESCRIPTION OF THE DRAWING FIGURES

The following detailed description of preferred embodiments can be read in connection with the accompanying drawings in which like numerals designate like elements and in which:

FIG. 1 schematically shows an exemplary embodiment of a nanowire.

Figure 8:
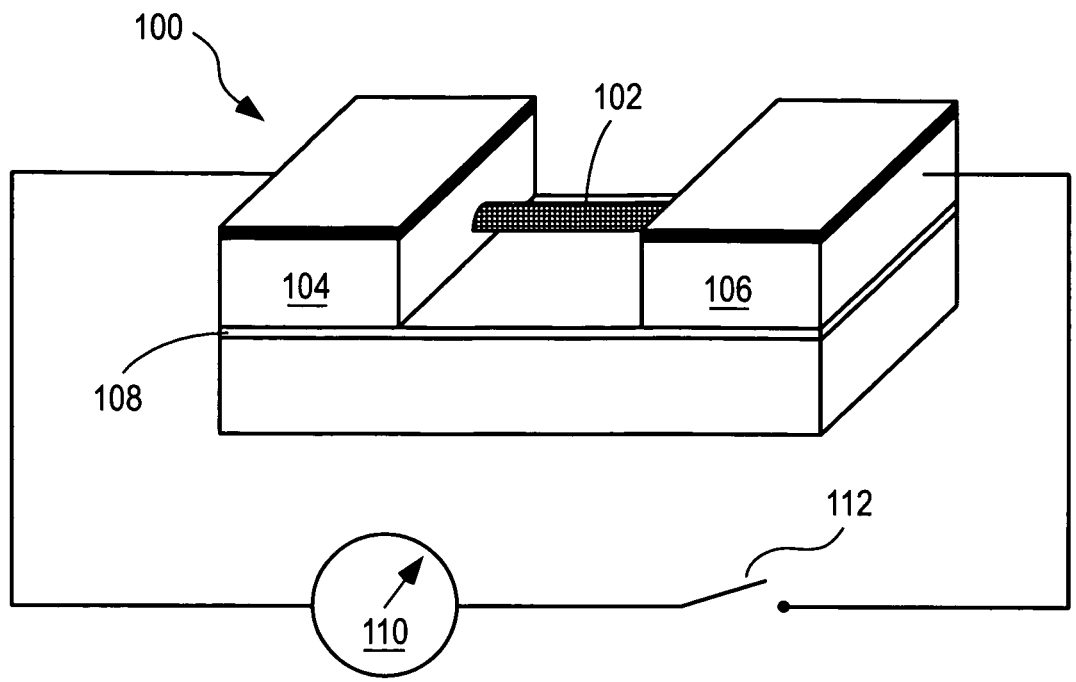

FIG. 8 schematically illustrates an exemplary embodiment of a circuit comprising a nanowire between two electrical contact points.

FIGS. 9A to 9D schematically illustrate an alternative exemplary embodiment of a circuit incorporating a nanowire.

FIGS. 10A to 10D schematically illustrate another alternative exemplary embodiment of a circuit incorporating a nanowire.

Figure 11:
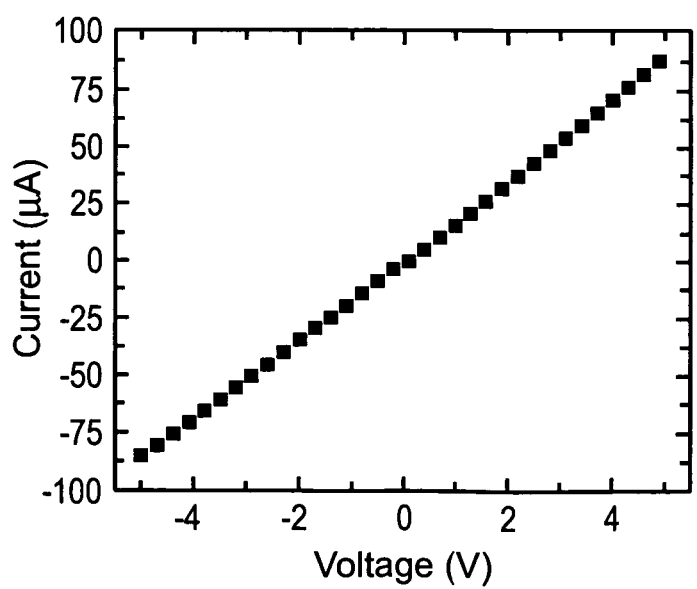

FIG. 11 is a graph showing the linear current-voltage characteristic between an electrode pair connected by six bridging nanowires.

DETAILED DESCRIPTION

Figure 1:
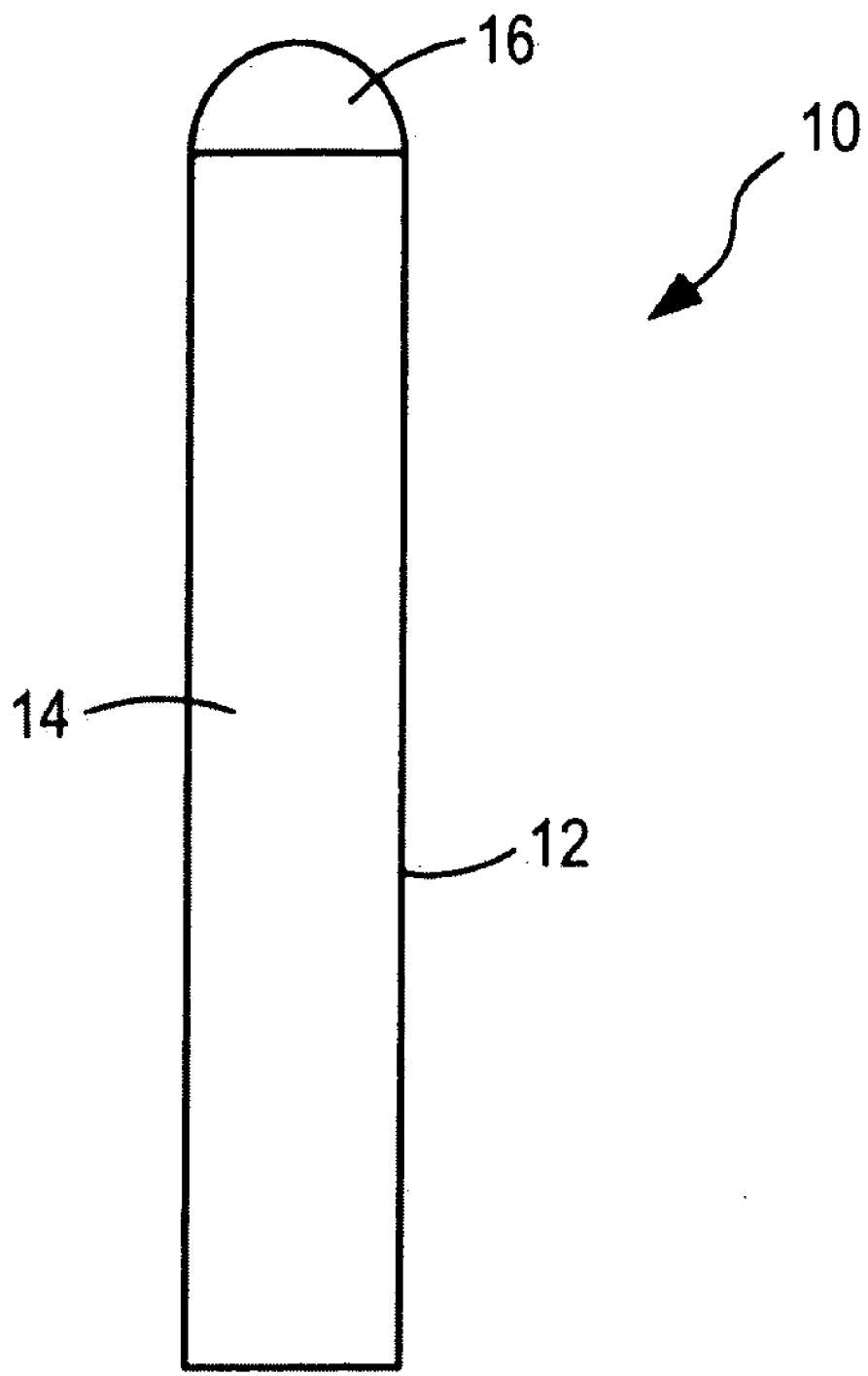
Figure 2:
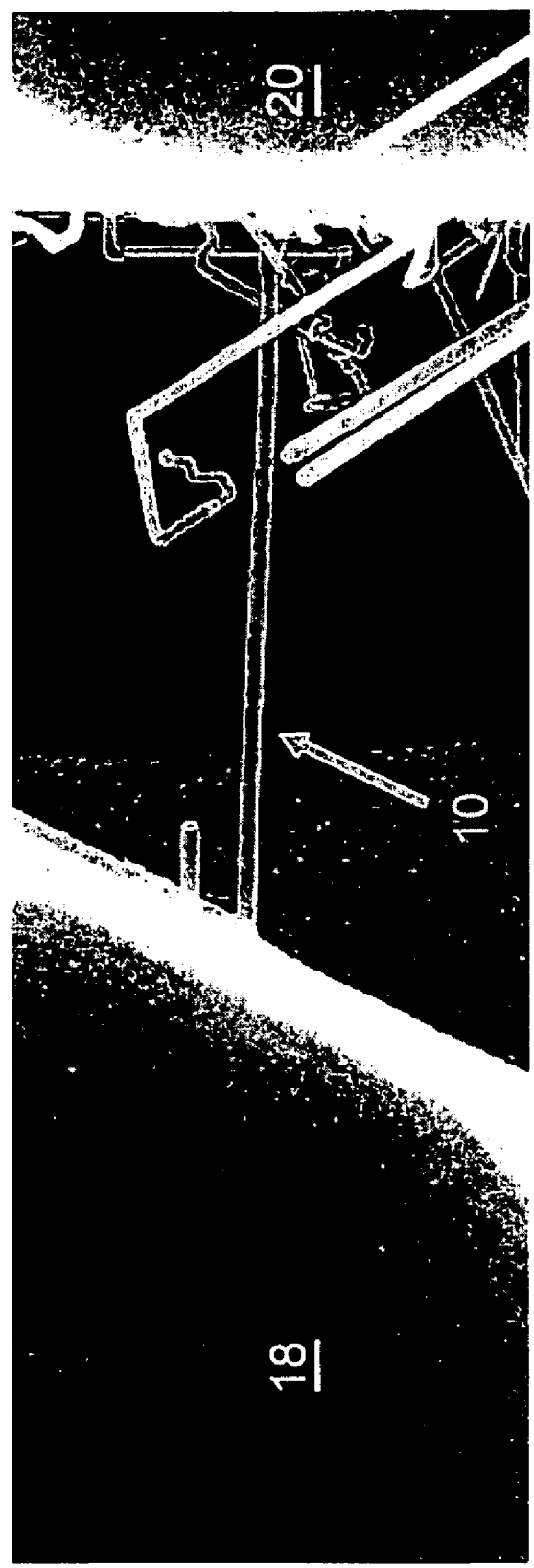
FIG. 2 is a scanning electron micrograph showing a single nanowire bridging between two electrodes.

An exemplary embodiment of a nanowire is schematically illustrated in FIG. 1. The exemplary embodiment of a nanowire 10 comprises a single crystalline semiconductor material having an exterior surface 12 and an interior region 14. In one embodiment, the nanowire 10 is columnar in shape and has a catalyst nanoparticle 16 at one end as a result of the metal catalyzed deposition process. FIG. 2 is a micrograph showing a nanowire 10 connecting between two electrodes 18, 20.

The nanowire contains dopant atoms. When in the interior region of the semiconductor material, the dopant atoms increase the conductance of the material. Conversely, when at the exterior surface of the semiconductor material, the dopant atoms do not increase the conductance of the material. In exemplary embodiments, the nanowires have a variable conductance state dependent on the number or concentration of dopant atoms at different regions of the nanowire. For example, the exemplary embodiments of nanowires can have a high conductance state and a low conductance state. In the high conductance state, a fraction of the dopant atoms, e.g., a certain concentration of dopant atoms, are in the interior region of the nanowire. In the low conductance state, a lower fraction of the dopant atoms, e.g., a lower concentration of dopant atoms, are in the interior region than the fraction or concentration present in the high conductance case. Also, in the low conductance state, the fraction of dopant atoms at the exterior surface in the low conductance case is higher than the fraction of dopant atoms at the exterior surface in the high conductance case. In another example, in the high conductance state, a first fraction of the dopant atoms are in the interior region and a second fraction of the dopant atoms are at the exterior surface, and wherein in the low conductance state, a third fraction of the dopant atoms are in the interior region and a fourth fraction of the dopant atoms are at the exterior surface, the first fraction greater than the third fraction and the second fraction less than the fourth fraction.

In some exemplary embodiments, the first fraction is selected to provide sufficient dopant atoms in the interior region and/or the exterior surface to achieve a first desired conductance, such as a conductance associated with a highly doped semiconductor, and the third fraction is selected to provide sufficient dopant atoms in the interior region and/or the exterior surface to achieve a second desired conductance, such as a conductance associated with a lightly doped or undoped semiconductor. For example, the first fraction can correspond to a concentration of $10^{19}$ cm$^{-3}$ to $10^{20}$ cm$^{-3}$ and the third fraction corresponds to a concentration of $10^{16}$ cm$^{-3}$ to $10^{17}$ cm$^{-3}$. Other concentrations can also be used based on desired conductance values and the intended application.

In addition, exemplary embodiments of nanowires can have intermediate conductance states in which the conductance values are intermediate to the conductance values in the high and low conductance states. In the intermediate conductance case, the fraction of dopant atoms, e.g., the concentration of dopant atoms, in the interior region is intermediate to the fraction or concentration of dopant atoms in the interior region in the high conductance case and the low conductance case.

As used herein, the values of conductance and resistance of the nanowire refer to the values at the operating temperature.

Figure 3A:
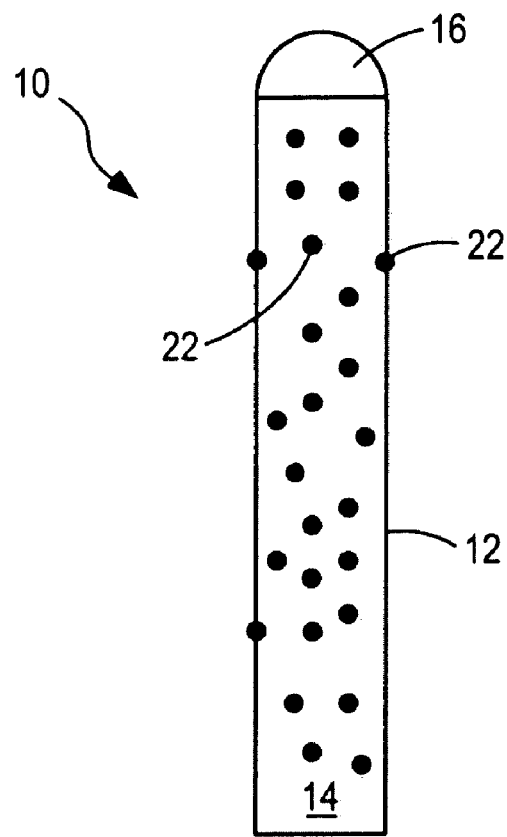
FIGS. 3A and 3B are schematic illustrations of cross-sections of an exemplary embodiment of a nanowire in a high conductance state (FIG. 3A) and a low conductance state (FIG. 3B)
Figure 3B:
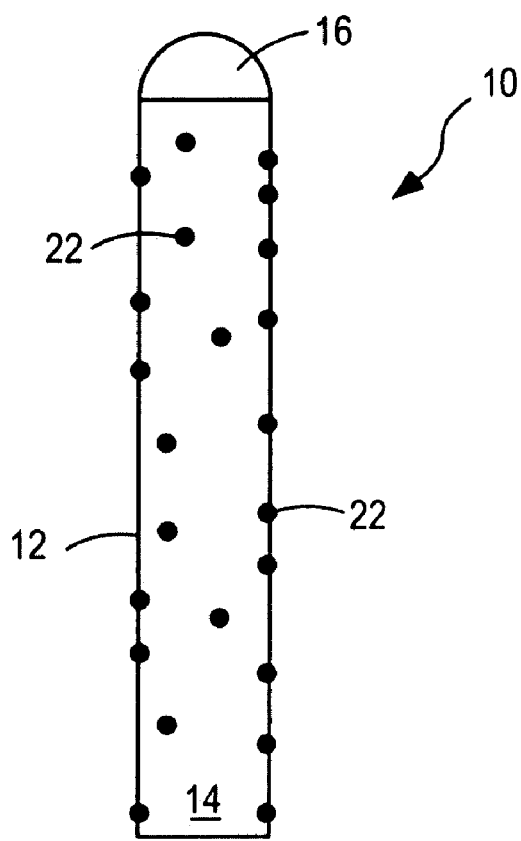

As an example, FIGS. 3A and 3B show cross-sectional views of an exemplary nanowire. One or more dopant atoms 22 are contained within the nanowire 10. At least a portion of the nanowire 10 can be thermally switched between two conductance states. For example, at least a portion of the nanowire 10 can be thermally switched from a high conductance state to a low conductance state. In addition, at least a portion (either the same or a different portion) of the nanowire 10 can be thermally switched from a low conductance state to a high conductance state. In the high conductance state (FIG. 3A), a large fraction of the dopant atoms 22 are in the interior region 14 or bulk of the nanowire; in the low conductance state (FIG. 3B), a lower fraction of the dopant atoms 22 are in the interior region 14 than in the high conductance state. In addition, in the low conductance state (FIG. 3B), the fraction of dopant atoms 22 at the exterior surface 12 is higher than in the high conductance state.

In exemplary embodiments, the single crystalline semiconductor material is an elemental semiconductor. Alternatively, the single-crystal semiconductor material is a compound semiconductor. Alternatively, the single crystalline semiconductor material is a III–V semiconductor. Alternatively, the single crystalline semiconductor material is selected from the group consisting of silicon (Si), germanium (Ge), indium phosphide (InP), and gallium arsenide (GaAs).

In exemplary embodiments, the dopant atom is an n-type dopant selected from the group consisting of phosphorus, arsenic, antimony and bismuth. The surface segregation for different n-type dopant elements increases in the order phosphorus, arsenic, antimony, and bismuth. Antimony is a less common dopant, and bismuth is not routinely used in silicon technology. Thus, of the common n-type dopant elements, arsenic segregates more strongly. Phosphorus also segregates and can have a higher diffusion coefficient than arsenic, making it attractive if faster diffusion is needed.

In some exemplary embodiments, the nanowire is formed by metal catalyzed chemical vapor deposition (CVD). Metal catalyzed CVD utilizes a small metal nanoparticle to accelerate the decomposition of a gas exposed to the nanoparticle. A suitable nanoparticle can be Ti- or Au-based. As an example, Ti- or Au-based nanoparticles on the order of as low as 5 nm average diameter have been demonstrated. The gas contains gaseous semiconductor-producing elements, such as silicon (Si), germanium (Ge), indium (In), phosphorus (P), gallium (Ga), arsenic (As) and other elemental and compound semiconductor elements. When exposed to the nanoparticles, the semiconductor-producing gas reacts and the semiconductor producing elements move to and precipitate and/or aggregate at the interface between the nanoparticle and the substrate, e.g., the back of the catalyst, to form a columnar structure, e.g., a nanowire, with a high surface-to-volume ratio. Other geometric structures can also be formed. By precipitating/aggregating at the back of the catalyst, the catalyst is pushed away from the surface on which the catalyst was originally deposited. The columnar structures are single crystalline phases of the semiconductor-producing elements, e.g., Si, GaAs, InP, Ge, and so forth, depending on the gas composition. Nanowires can also be grown without reference to a substrate by precipitation and growth in the gas phase.

Figure 4A:
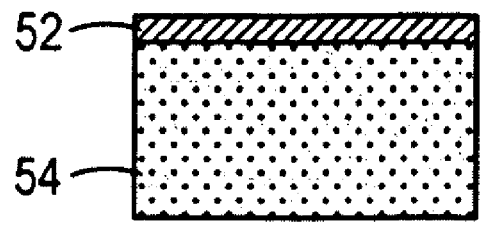
FIGS. 4A to 4C show a schematic illustration of metal-catalyzed nanowire growth using chemical vapor deposition (CVD).
Figure 4B:
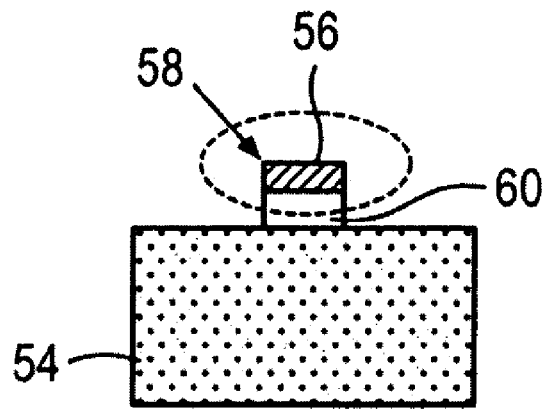
Figure 4C:
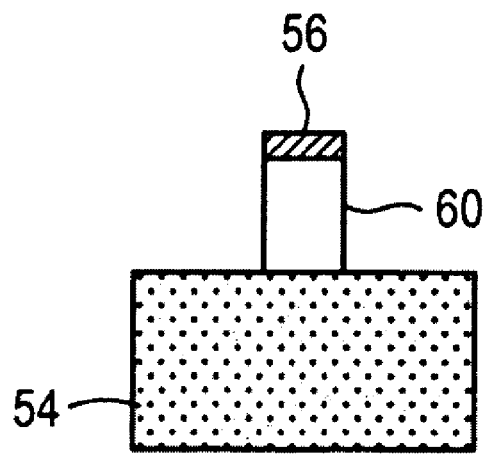

FIGS. 4A to 4C illustrate an exemplary formation process 50. In FIGS. 4A to 4C, a metal film 52 is deposited on a substrate 54. For example, Ti can be deposited on a Si substrate and annealed to form a $TiSi_2$ nanoparticle catalyst. Other example metals include Au, Pt, Ni, Pd and Ga and others as known in the art. Subsequently (see FIGS. 4B and 4C), the metal or $Me_xSi_y$ nanoparticle catalyst 56 is exposed to an atmosphere 58 containing a gas with semiconductor-producing elements, such as $SiH_4$ or $SiH_2Cl_2$. The atmosphere 58 can also optionally include other species, such as an etchant species or a dopant-containing species. The temperature during this process is elevated, for example about 600 to 700° C. The semiconductor-producing element precipitates from the gas at a position behind or below the nanoparticle catalyst 56, forming a semiconductor columnar structure 60 with the nanoparticle catalyst 56 at an advancing end of the columnar structure 60. Subsequent and/or continued growth of the semiconductor columnar structure 60 is governed by, amongst other things, the continued exposure to the gas with a semiconductor-producing element.

The seeding at a growth location can be by any suitable means. For example, the nanoparticle can be deposited on a growth location by a physical deposition technique. Masks, post-deposition manipulation and/or pre- and post-chemical treatments can be used to limit the locations on which the nanoparticle is deposited, move or remove the deposited nanoparticle, and/or activate/deactivate portions of the growth location. For example, nanoparticles can be grown independent of the substrate, put in suspension, and deposited on a surface for subsequent growth of nanowires. Masks can be used to delineate patterns or regions of the surface. Also, post-deposition manipulation with, for example, atomic force microscopy (AFM) or other techniques, can be used to position the nanoparticles or the nanowires. In other example techniques, nanowires can be grown vertically from a substrate and a second contact formed on top of the nanowires. The seeding at one growth location and growing the nanowire to contact another contact location, e.g. a directed growth method, results in an intimate bonded contact at both the originating surface and the contacted surface. For example, the contact can be a Si to Si bond.

In exemplary embodiments, the growth density of the nanowires on the growth surface is from one to a few nanowires (e.g., 1 to 10, 1 to 3, up to 15). In other applications, many nanowires may be desirable (e.g., up to 50 or up to 75). The total conductance between the originating surface on an electrode and the contacted surface on another electrode depends on density of nanoparticles, diameter of nanowires and the size of electrodes from which the wires are growing; a higher density of nanoparticles on the growth surface results in a higher density of nanowires, which generally results in a higher total conductance. Observations indicate there is approximately a one-to-one correlation in diameter between nanoparticles and nanowires.

The general dimensions of the radial diameter of the nanowire can be selected by selection of the size of the diameter of the starting nanoparticle. For example, observations indicate that the columnar radial diameter of the nanowire is within approximately ±10% of the diameter of the starting nanoparticle diameter. This observation suggests that selection of the nanoparticle size can control the radial diameter. Nanoparticle sizes, and thus the resulting radial diameters, are in the range of less than 100 nm, alternatively 1 to 5 nm, and alternatively 5 to 50 nm, and further alternatively less than 40 nm. In exemplary embodiments, the diameter of the nanowire is sufficient to have diffusion lengths and diffusion kinetics of the dopant species to allow desired switching times at a programming temperature, e.g., greater than or equal to about 700° C. to 800° C., preferably at or above 800° C. up to or above 1000° C., which is much greater than the operating temperature, e.g., from room temperature to about 100° C.

The programming temperature is at least partially dependent on the semiconductor material of the nanowire. For example, a programming temperature for Si is greater than about 800° C. Also, a nanowire dimension can be configured small enough for rapid diffusion and short diffusion times at a programming temperature and slow diffusion and long diffusion times at operating temperatures. It is noted that programming time is proportional to diffusion length (L), where $L=2\sqrt{Dt}$. D is the diffusion coefficient, and t is the time at elevated temperature during which the dopant atoms can move within the nanowire. In exemplary embodiments, the diffusion length (L) is less than about 1 μm, alternatively less than 100 nm, 50 nm, 40 nm or 10 nm. The diameter can be selected to be compatible with a desired programming speed. It is noted that faster speed can result from a smaller diameter as well as result from programming at higher programming temperature, or a combination of these approaches.

The general dimensions of the length of the nanowire can be any desired length. Although any length can be used, at least a portion of the length of the nanowire is a switchable region, e.g., the conductance can be changed by the position of the dopant atoms within the nanowire and the conductance can be programmed at a programming temperature for high conductance and cooled to an operating temperature at a sufficient rate to maintain a desired high conductance. Further, it is noted that if the nanowire is too long, then it may be difficult to cool the entire nanowire and/or a switchable region quickly enough from the programming temperature to maintain the desired conductance state. Also, it is noted that if the nanowire is too short, then it may be difficult to raise the temperature of the entire nanowire and/or a switchable region quickly enough to establish the desired conductance state.

Figure 5A:
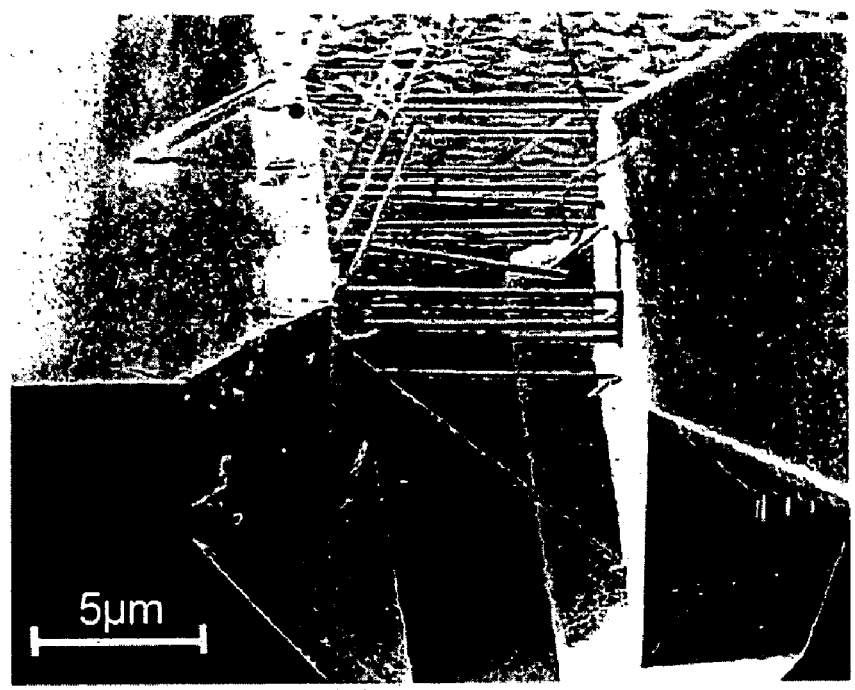
FIGS. 5A and 5B are scanning electron micrographs showing, respectively, a plurality of nanowires between two electrodes and a single nanowire between two electrodes.
Figure 5B:
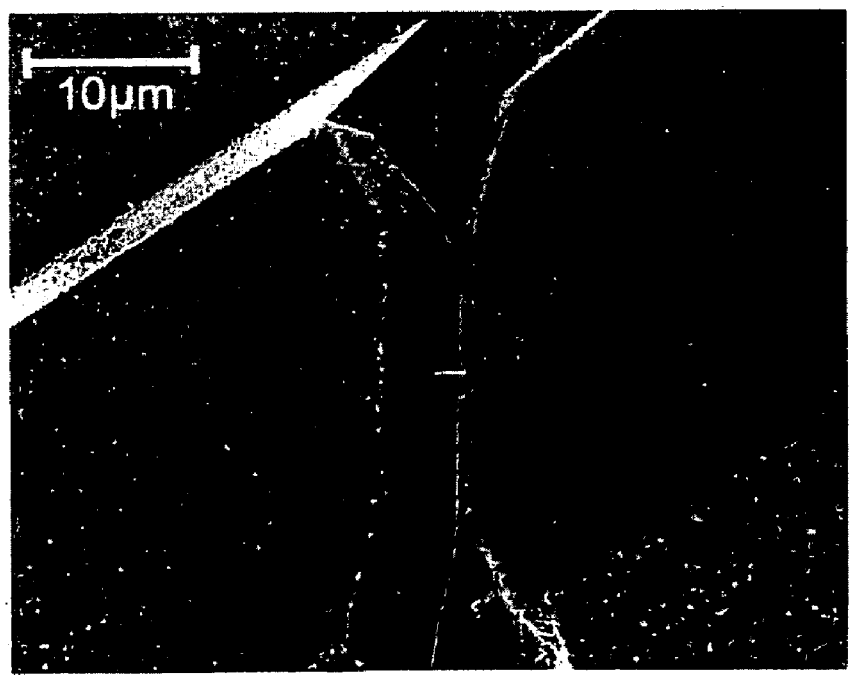

Observations on silicon nanowires indicate that preferential growth of silicon in a columnar structure occurs normal to the (111) crystallographic plane. Suitable substrates can be formed by photolithography processes. In exemplary embodiments, the columnar structure can be a singularity, e.g., a single nanowire, or can be a plurality of structures, e.g., a group of nanowires, which may be parallel and closely spaced with a small distance between nanowires or may be spaced further apart. FIGS. 5A and 5B are photomicrographs showing a plurality of Si nanowires between Si electrodes (FIG. 5A) and showing a single Si nanowire between Si electrodes (FIG. 5B).

There is a correlation between the nanowire growth and the degree of misorientation of the growth surface, e.g., misorientation from the (111) crystallographic plane in Si due to, for example, mask misorientation. For example, in a (110)-oriented Si wafer the anisotropic etching depends sensitively on the in-plane crystallographic orientation of the mask edge defining the region to be etched, and accurately orienting the mask with the substrate is critical. For example, severe undercutting of the mask occurs without accurate orientation. Mask misorientation also leads to ledges in the vertical sidewalls of the grooves. The ledges contain many steps and kinks, which can extend from the top of the sidewall face to the bottom. Although normally undesirable, these irregularities may offer some advantages for preferentially positioning the catalyst nanoparticles; the higher density of broken bonds in these regions may create low-energy sites for catalytic nuclei. The density and orientation of grown nanowires can vary because of mask misorientation.

Figure 6:
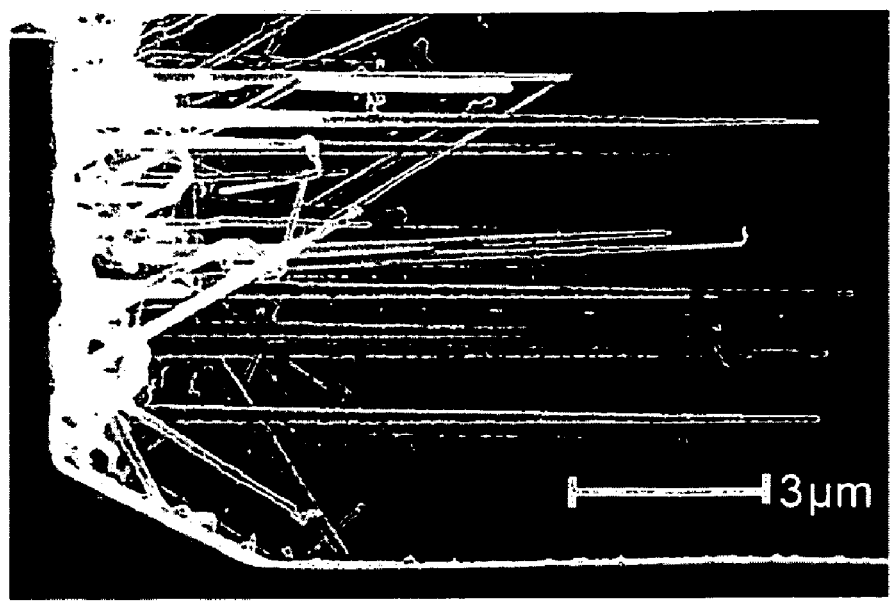
FIG. 6 shows Au-nucleated Si nanowires growing laterally from one (111)-oriented face toward the opposing face and extending partially across a 15-μm wide separation distance.
Figure 7:
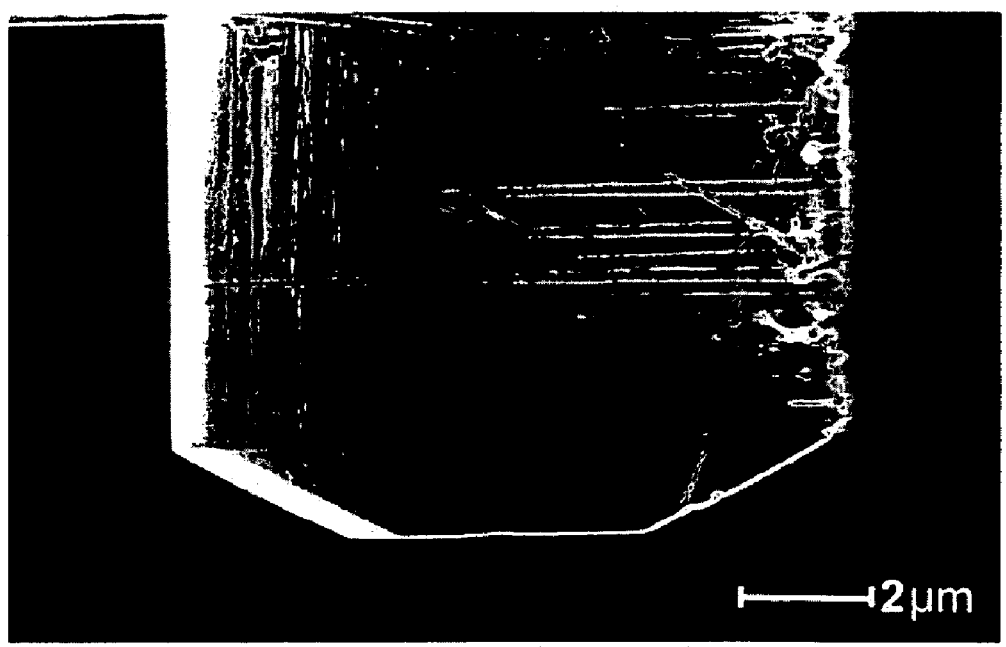
FIG. 7 shows many Au-nucleated nanowires extending completely across an 8 μm wide separation distance.

Lateral growth and mechanical connection of nanowires across a separation distance between, e.g., electrodes, have been demonstrated. Both Ti and Au catalysts have been used. FIG. 6 is a micrograph showing Au-nucleated Si nanowires growing laterally from one (111)-oriented face toward the opposing face and extending partially across a 15-µm wide separation distance for the specific deposition parameters used in this demonstration. For separation distances 8 µm wide or less, many Au-nucleated nanowires extend completely across the separation distance, as shown for an 8 µm wide separation distance in the micrograph in FIG. 7. In the demonstrated structures, approximately 70% of the nanowires intersect the opposing sidewall at an angle of 90°±0.5°.

Embodiments of nanowires as disclosed herein can be incorporated into electronic devices and circuits as conducting elements, switches, and the like. For example, an exemplary embodiment of a circuit is schematically shown in FIG. 8. The exemplary circuit 100 comprises a nanowire 102 bridging between two electrical contact points 104, 106. The electrical contact points 104, 106 sit on a layer of insulating $SiO_2$ 108.

Figure 9A:
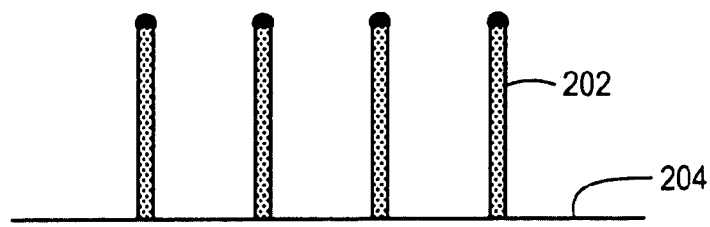
Figure 9B:
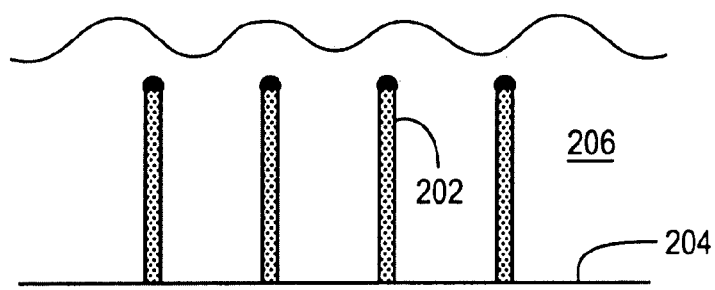
Figure 9C:
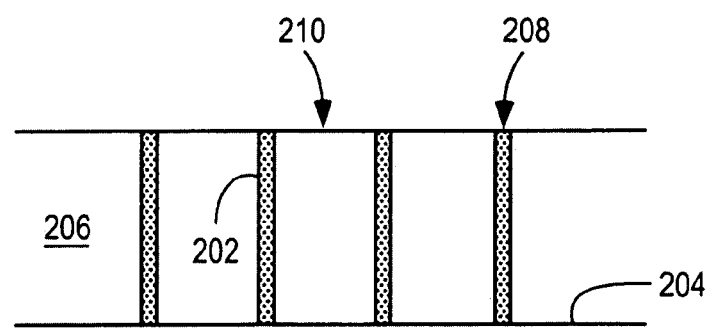
Figure 9D:
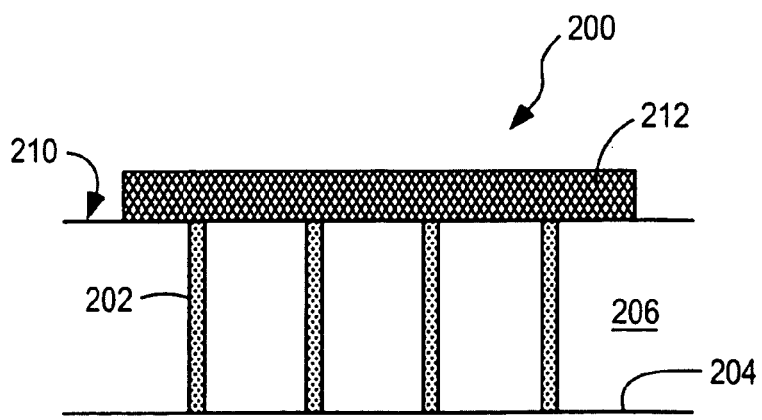

An alternative embodiment 200 is shown in cross section in FIGS. 9A to 9D. FIG. 9A shows nanowires 202 grown vertically from a horizontal (111)-oriented Si surface plane 204 so that the nanowires 202 make one electrical connection to the substrate (for example, the electrically isolated top Si layer of an SOI structure). An insulating layer 206 is then added (e.g., by chemical vapor deposition) to fill the space between the nanowires 202; it also may coat the ends of the nanowires. An example insulating layer is shown in FIG. 9B as a deposited oxide layer. The ends 208 of the nanowires 202 are then exposed by, for example, chemical-mechanical polishing. FIG. 9C schematically illustrates a chemical-mechanical polished surface 210 exposing the second end of the nanowires 202. Chemical-mechanical polishing can also provide a smooth surface. As illustrated in FIG. 9D, a metal electrode 212 can then be deposited on the insulating layer 206 and exposed ends 208 of the nanowires 202 and defined to form the second electrical connections to the nanowires 202.

Figure 10A:
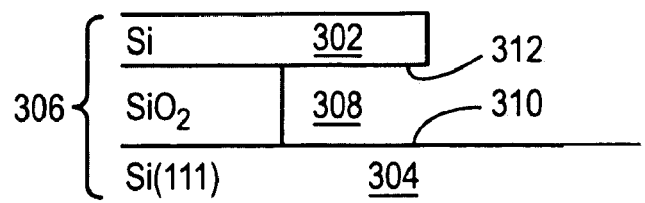
Figure 10B:
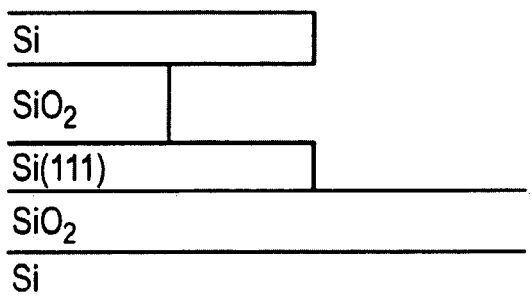
Figure 10C:
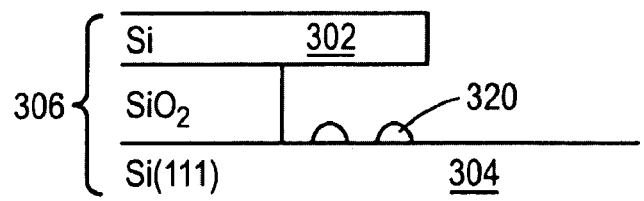
Figure 10D:
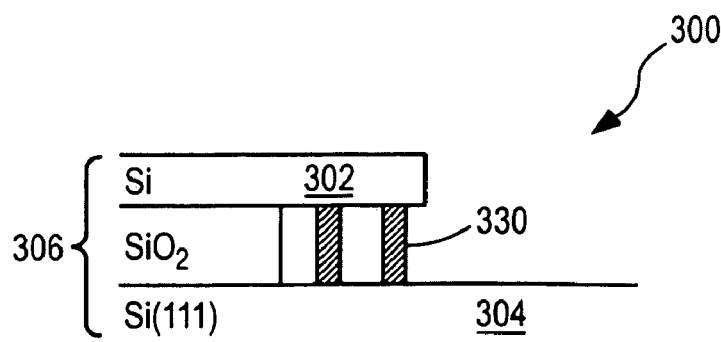

FIGS. 10A to 10D schematically illustrate another alternative exemplary embodiment of a circuit 300 incorporating a nanowire. As illustrated in FIG. 10A, two horizontal Si layers 302, 304 are formed, for example using epitaxial overgrowth, so that an empty space 308 exists between two horizontal semiconducting or conducting surfaces, a first horizontal surface 310 and a second horizontal surface 312 in the structure 306. Alternative arrangements for the planes and the space can also be used, such as the SOI structure shown in FIG. 10B. In FIG. 10C, metal catalyst 320 is placed on at least one of the horizontal surfaces within the empty space 308 between the two horizontal surfaces 310, 312 by angled or selective deposition, and the structure 306 is exposed to a semiconductor containing gas. The nanowires 330 grow vertically from one horizontal surface to another and automatically connect ("bridge") to the second horizontal surface, forming "vertical bridging nanowires," as illustrated in FIG. 10D.

Exemplary embodiments of the nanowire include a single crystalline semiconductor material having an exterior surface and an interior region and n-type dopant atoms. In some exemplary embodiments, the single crystalline semiconductor material is an elemental semiconductor. In alternative exemplary embodiments, the semiconductor material is a compound semiconductor. In alternative exemplary embodiments, the single crystalline semiconductor material is selected from the group consisting of Si, Ge, InP, or GaAs Conductance of a semiconductor is influenced by the number of electrically active dopant atoms in substitutional sites within the semiconductor. Dopant can be added to the nanowire during the growth process or after formation of the grown nanowire. Changing the conductance after growth and initial doping of the nanowire enables programmability of the nanowire. For example, when in the interior region of the semiconductor material, e.g., when in a substitutional position within the bulk of the single crystal semiconductor material, the dopant atoms increase the conductance of the material. Conversely, when at the exterior surface of the semiconductor material, e.g., at the exterior portion of the single crystal semiconductor material or at a grain boundary for polycrystalline semiconductor material, the dopant atoms do not increase the conductance of the material.

Initial doping of the nanowire can be by any suitable means. For example, the nanowire can be doped with dopant atoms during formation of the nanowire. In one example of doping nanowires during formation, dopant atoms are introduced into the reactor during nanowire formation by, e.g., introducing a dopant-containing gas, such as phosphine ($PH_3$) or arsine ($AsH_3$). In this case, the nanowire is initially doped with dopant atoms in the interior region of the nanowire. Depending on cooling rate, the initial conductance of the nanowire is high (e.g., from rapid cooling) or the initial conductance of the nanowire is low (e.g., from slow cooling). The nanowire can also be doped with dopant atoms after formation of the nanowire. Example initial doping techniques after growth include gas-phase or solid-phase diffusion using conventional heating or using rapid thermal processing. In one example, the formed nanowire can be exposed to a dopant-containing gas, such as phosphine ($PH_3$) or arsine ($AsH_3$) while the nanowire or a region of the nanowire is at an elevated temperature. In another example, dopant atoms can be introduced into the nanowire from a deposited layer containing dopant atoms, such as a deposited layer of $SiO_2$. In another example, dopant atoms can be implanted, e.g., ion implanted, into the nanowire, but such a technique may damage the crystal structure of the nanowire.

In very small devices, virtually all of the volume of the element is close to the surfaces. Under suitable conditions, dopant atoms can move between the bulk, where they are electrically active, and the surfaces, where they are not active. In some exemplary embodiments, the dopant species is selected from the group consisting of phosphorus, arsenic, antimony and bismuth. The commonly used n-type dopant atoms, phosphorus and arsenic tend to segregate to the surface because of their lower energy positions there.

The tendency to segregate to the surface is a thermodynamic property based on the energy of the dopant atoms within the crystal compared to that at the surface. Both chemical and size effects can lead to segregation.

With respect to the size effects, in one aspect if the size of the dopant atom is different than that of the matrix atom that it replaces, the strain resulting from this mismatch can be reduced by moving the dopant atom to the surface, where the different size can be accommodated by the less constrained surface region. The amount of segregation depends on the energy difference between the two positions and can be high; given enough time and the ability to move, the dopant atoms will reach an equilibrium distribution between the bulk and the surface. The tendency to segregate, e.g., the driving force to move toward the exterior surface region, is a function of temperature and increases as the temperature decreases and decreases as the temperature increases according to the formula $\exp(E_a/kT)$, where $E_a$ is the energy difference between the bulk and the surface sites, k is Boltzmann's constant and T is the absolute temperature. Therefore, at higher temperatures, the dopant atoms experience only a small preference between being in bulk substitutional positions and being at the exterior surface region. At low temperatures, the exterior surface region is a more strongly favored position for the dopant atoms.

With respect to the chemical effects, in one aspect the molecular attraction and repulsion between the dopant atom and the matrix atom determines the driving force to segregate toward an equilibrium distribution. The rate of segregation toward the equilibrium distribution between the bulk and the surface depends on the ability of the atoms to diffuse, i.e., kinetic effects.

Although segregation results from the thermodynamic properties of the system, it takes a finite amount of time to segregate, which depends on the distance to the surface and the temperature of the device. This is a kinetic effect. If the device is heated for an adequate length of time, the dopant atoms can segregate to their equilibrium distribution corresponding to the heating temperature. At higher temperatures, fewer dopant atoms segregate to the surface and the resistance (measured at the operating temperature) is lower; at lower heating temperatures, more dopant atoms segregate to the surface, removing the electrically active dopant atoms and increasing the resistance. If the device is cooled rapidly from the higher heating temperature, the dopant atoms do not have adequate time to redistribute toward the surface; the dopant atoms remain in their substitutional sites within the bulk of the device corresponding to the higher heating temperature, and the resistance remains low (and the conductance remains high). Thus, kinetic limitations can prevent the dopant atoms from reaching their thermodynamically favored position at low temperatures when the material is rapidly cooled. At the operating temperature, the time for the dopant atoms to move to their energetically favored positions can be more than many hundreds of years.

This kinetic limitation can be used to control the resistance of a nanometer scale device. By varying the cooling rate, the conductance of the device can be varied. For conventional device dimensions, the time required for the dopant to move to the surface can make the switching time excessively long for practical device programming speeds or the temperature must be high enough that heating of nearby structures becomes excessive (or the spacing must be artificially increased, which is not economical). However, in the size regime relevant to nanoelectronics (1 to 100 nm), the times can be short even at practical temperatures.

In an exemplary embodiment of a method to program the conductance of a nanowire formed of a single crystalline semiconductor material, a temperature of the nanowire at least in a local region is increased to a programming temperature to thermally activate diffusion of dopant atoms in a bulk region of the single crystalline semiconductor material. The temperature of the nanowire at least in the local region is then decreased to a second temperature to immobilize dopant atoms in the bulk region of the single crystalline semiconductor material. If the nanowire is cooled rapidly, the dopant atoms do not have time to diffuse to the surface before they are immobilized when the temperature of the nanowire reaches a low value, even though lower temperatures energetically favor a dopant atom distribution with more dopant atoms at the surface. The immobilized dopant atoms in the bulk region produce a high conductance state in the nanowire. If the nanowire is cooled slowly, at intermediate temperatures the dopant atoms not only favor a distribution with more dopant atoms at the surface but they have adequate time to diffuse to the surface; because the dopant atoms move from the bulk region, the conductance of the nanowire decreases. The nanowire may also be initially heated to an intermediate programming temperature that is high enough that the dopant atoms have a diffusion length comparable to or greater than the diameter of the nanowire but low enough so that the thermodynamic distribution of the dopant atoms between the bulk and the surface favors the surface more than at the high programming temperature. The resulting distribution corresponds to a high-resistance state of the nanowire. As a refinement, the nanowire may be heated to the high programming temperature to remove prior history of the state of the nanowire dopant distribution and then cooled to the intermediate temperature and optionally held at the intermediate temperature for a long enough time so that the dopant distribution approaches its equilibrium value at this intermediate temperature. The resulting distribution corresponds to a high-resistance state of the nanowire. The nanowire can then be cooled to the operating temperature. The cooling rate is less critical because the nanowire is already in its high-resistance state and any further dopant segregation is not important for many applications (for example, for digital-circuit applications); if further dopant segregation occurs, it will only increase the resistance within the range of the high resistance state of the nanowire. If the value of the resistance is critical (for example, for analog-circuit applications), then the cooling rate is still controlled to achieve a desired value of the resistance.

Normal operating temperatures for a nanocircuit incorporating the nanowire are about room temperature to 100° C. In such an exemplary method, the temperature is raised above 800° C., e.g., for Si, and rapidly cooled to a temperature at which the dopant atoms cannot move in a reasonable time (for example, cooled to less than 400° C. for Si; in another example, cooled at least in the local region to less than 500° C. at a rate of at least $10^5$ degrees/sec). For example, the temperature can be raised to a first, programming temperature greater than or equal to about 800° C. (for Si) and then cooled to a second temperature below the programming temperature to immobilize the dopant atoms. The programming temperature can be achieved in the nanowire, in one exemplary embodiment, by passing a current through the nanowire. External heat sources can also be used or combinations of techniques. These heating sources and methods can include radiative, conductive and convective sources and methods. Heating rates are not critical to the programmability of the nanowire, but the heating method needs to heat to an adequate temperature, e.g., a temperature at which programming can occur.

In one exemplary embodiment, a second nanowire can be positioned at an angle to a first nanowire and approaches the first nanowire at an interaction point, e.g., a point where heat from the second nanowire raises a temperature of the first nanowire. A current can be passed through the second nanowire to raise a temperature of the first nanowire at the interaction point. This may be repeated to repeatedly raise and lower the temperature of the first nanowire. The heat transfer from the second wire to the first nanowire can be radiative, e.g., heat radiating from the second nanowire, not in contact with the first nanowire, conductive, e.g., through an electrically insulating layer between the second nanowire and the first nanowire, or convective, e.g., heat transferred through a medium such as air or other atmosphere. The heat transfer technique can vary based on the structure of the nanowires and their arrangement.

Cooling can be achieved in the nanowire, in one exemplary embodiment, by removing current flowing through the nanowire, followed by removing the heat from the nanowire. The heat can be removed by cooling techniques that can include ambient cooling, which may be dominated by heat flow though the contact point of the nanowire with the electrodes (depending on length of the nanowire or distance from the switchable region to the contact points), and heat removal to surrounding material, e.g., air or a dielectric, and heat removal by thermal coupling to a heat sink, or combinations thereof. In exemplary embodiments, removing the current flow can rapidly cool (on the order of μsec) the nanowire or switchable region. Alternatively, the current flow can be gradually reduced to produce a slow cooling (on the order of msec) to allow diffusion of dopant to the surface.

Also, an intermediate rate can be selected to produce an intermediate conductance between a high conductance associated with high bulk dopant concentrations and a low conductance associated with low bulk dopant concentrations.

Typical values for high bulk dopant concentration and low bulk dopant concentration in Si are $10^{20}$ cm$^{-3}$ and $10^{16}$ cm$^{-3}$, respectively, although the programming effect and the switchability of the conductance states can also occur at smaller ratios of high to low concentration, for example at concentrations of $10^{19}$ cm$^{-3}$ and $10^{17}$ cm$^{-3}$, respectively. In some cases, such as tuning sensors or the channels of field-effect transistors, the ratio between the dopant concentrations in the initial and final states may be considerably smaller, e.g., less than or equal to 10. In another exemplary embodiment, the nanowires are incorporated into a chemical sensor, in which an interaction with a detected chemical species changes the number of mobile carriers in the nanowire, thereby changing the electrical conductance. In another exemplary embodiment, the nanowires serve as channels of field-effect transistors.

To program a nanowire and/or a circuit with one or more nanowires, the temperature of the nanowire or a switchable region of the nanowire is raised and reduced. Means for raising and reducing the temperature can be any suitable means. In an exemplary embodiment, means for raising and reducing the temperature passes a current through the nanowire and open circuits or removes the current from the nanowire. For example, FIG. 8 shows a circuit 100 with a nanowire 102 bridging between two electrical contact points 104, 106. The electrical contact points 104, 106 sit on a layer of insulating SiO$_2$ 108. A means for raising and reducing the temperature, such as current source 110 and switch 112, are electrically connected to the two electrical contact points 104, 106 to complete the circuit 100. The current source 110 can be variable to select the amount of current and the amount of heat generated by passing the selected current. Variable current can also be used to select a rate of temperature increase and/or a rate of temperature decrease.

Other means for raising and reducing the temperature include external heating and cooling sources including dedicated heating and cooling elements included in the architecture of the device. For example, heat sources, such as convective, radiative and conductive heat sources, and heat sinks can raise and reduce the temperature. In an exemplary embodiment, a second nearby nanowire can be heated by current flowing through this second nanowire. Generated heat in the second nanowire can be transferred from the second nanowire to the first nanowire by conduction, radiation, and possibly convection. The second nanowire can be parallel to the first nanowire to heat much of the length of the first nanowire, or it can be located at an angle to the first nanowire to heat only a localized area of the first nanowire, e.g., the localized area can be the area at the interaction point between the first nanowire and second nanowire that are sufficiently collocated that one nanowire can thermally influence the second nanowire. FIGS. 2, 5A, 5B, 6 and 7 are micrographs showing multiple nanowires with some nanowires being proximate to other nanowires, either parallel or with an angle relationship. Such nanowires when individually addressed can pass or remove a flow of current. In addition, the nanowire or circuit with one or more nanowires can have the conductance of the nanowire repeatedly selected by, for example, repeatedly raising and reducing the temperature of the nanowire or switchable region of the nanowire, e.g., by any suitable means for repeatedly raising and reducing the temperature including those described herein.

The heating can be most readily accomplished by forcing electrical current through the element, with the highest temperature determined by the power delivered $P=IV=I^2R=V^2/R$ and the rate of heat loss from the heated region. The temperature increase can be maximized by surrounding the nanowire switching element with materials with lower thermal conductivity (such as silicon dioxide) to minimize heat loss. At the nanoscale, much of the heat is lost to the conductors supplying the heating current to the nanowire, and their geometry can also be controlled. In one embodiment, at the highest temperature of the programming cycle, the distribution of dopant atoms between the surface and the bulk of the nanowire approaches equilibrium. At these temperatures, segregation is a minimum. As the nanowire cools, the tendency to segregate increases, and the time available to segregate is controlled by varying the cooling rate. In turn, the cooling rate can be controlled by the rate at which the heating power is decreased. Rapidly decreasing the power does not allow time for significant dopant segregation to occur, and the resistance remains low; slowly cooling the element allows time for significant segregation as the nanowire cools and the resistance increases. The critical time for dopant segregation depends on the dimensions of the nanowire, the dopant species, and the temperature.

Relying on movement of dopant atoms in a semiconductor, such as Si, is advantageous, because of the ease of fabrication using well characterized and straightforward integrated-circuit (IC) fabrication techniques. Major new techniques do not need to be developed, allowing more flexibility in the other components of the nanoelectronic circuitry. Using a simple, resistor structure of compatible materials aids easy incorporation into programmable devices and other nanoelectronic devices, such as sensors fabricated with technology based on integrated circuits (ICs) and micro-electro-mechanical systems (MEMS).

To take advantage of the dimensions of nanoelectronic devices, programming elements are useful. A feature of exemplary embodiments of nanoelectronic devices incorporating programmable nanowires is defect tolerance and/or reconfigurability. Generally, defect tolerance (initial configurability) involves a large block of circuitry that may not be fully functional/programmed as initially built. Subsequent defect mapping of the circuitry provides a general spatial understanding of the circuitry. Defective circuit elements can be avoided by routing signals around or bypassing these defective elements. This rerouting can be done by an initial programming of connecting nanowires (there are, for example redundant or extra nanowires in the general circuit). Initial configurability can also be used to specialize a circuit for a particular application without the cost of creating a mask to configure the circuit; this is valuable for circuits that will be needed in small numbers and also reduces the cost of handling and stocking specialized circuits. Generally, reconfigurability occurs at a post-initial build position (after use, e.g., updating the code of the circuit, or changing operating algorithms such as in mobile phones or repairing circuitry that fails during operation) wherein the nanowires are programmed to change conductance and, e.g., to send current to a different part of an IC chip. Reconfigurability can be done repeatedly.

Initial configuring and reconfiguring the nanoelectronic function can be used to bypass malfunctioning portions of the nanoscale circuitry, allowing use of partially defective arrays and, thus, smaller dimensions than can be used when 100% yield is required. The programming elements can be electrically controlled for reconfigurability and also to allow connections to be programmed based on an initial mapping of the defects in an array or to configure specialized circuits where configuring the circuits with conventional masks is not preferred, for example for economical reasons. For reconfigurability, the conductivity of the programming element is capable of being changed many times; for initial configurability, one or a few switching cycles will be adequate. Moderate switching speeds (for example, in the millisecond range) will be adequate for these applications, with the range of uses increasing if the programming elements can respond faster (e.g., can respond in the microsecond and nanosecond range).

To form functioning nano-devices, the electrodes are isolated from each other, at least one is isolated from electrodes of other devices, and one or both can be isolated from the substrate, which might contain other electronic components, and then one or more of these electrically isolated regions is connected by the nanowire to complete an electrical circuit. As one example, electrical isolation can be provided by forming the electrodes from a heavily doped, (110)-oriented, top silicon layer of a silicon-on-insulator (SOI) structure, in which a layer of silicon dioxide separates the top silicon layer from the mechanically supporting underlying silicon wafer. Removing the entire thickness of the top silicon layer between the electrodes provides the necessary electrical isolation. Because the two sets of (111) planes perpendicular to the surface of a (110)-oriented layer are oriented at 70° to each other, patterns with 70° corners produce the best defined electrodes. The corners also etch crystallographically, leading to enhanced undercutting at corners. Defining compensating electrode features on the mask can minimize this undercutting.

After etching the top masking oxide by conventional reactive-ion etching, the silicon is etched in an anisotropic etchant, such as KOH, until the underlying oxide layer is exposed. For ease of making subsequent electrical contact, the masking oxide on top of the electrodes can be removed before further processing, but the oxide layer separating the top silicon layer from the substrate must remain to provide the needed electrical isolation. Measurements of current-voltage characteristics between isolated electrodes spaced 10 μm apart and separated from the substrate by a 120 nm thick oxide layer show a leakage current of only a few picoamperes with 5 V applied.

After defining the electrodes, the catalyst is evaporated at an angle $\Theta$ ($\Theta \neq 90°$) to the substrate surface plane so that it is deposited on one or both of the sidewall faces between the electrodes. Nanowire growth depends on the size of the catalyzing nanoparticles at the start of the deposition process, and consequently on the amount of catalyst deposited on the surface and the subsequent thermal treatments. In the case of gold, if the amount of gold deposited on the exposed silicon surface is less than a critical amount, the nanoparticles are too small to enable nanowire growth. The dependence on the amount of gold deposited can be used to selectively form nanowires on some surfaces without growing them on other surfaces, thus simplifying further processing. If gold is evaporated at a small angle $\Theta$ from the surface plane of the wafer, the thickness of gold deposited on the vertical surfaces is d cos $\Theta$, where d is the thickness on a surface held normal to the beam of evaporated material. The thickness of gold deposited on horizontal surfaces is d sin $\Theta$. If $\Theta$ is chosen to be small (e.g., about 20°), the amount of catalyst on vertical surfaces is above the critical thickness for nanowire growth, while that on horizontal surfaces is below the critical thickness. Therefore, nanowires grow from the vertical surfaces, as desired, while none grow on horizontal surfaces simplifying subsequent processing. As an example, FIG. 5A shows two isolated electrodes bridged by about 15 nanowires while FIG. 5B shows electrodes bridged by a single nanowire.

In addition, to avoiding nanowire growth on the silicon at the top of the electrodes, no catalyst should be deposited on the exposed oxide layer between or adjacent to the electrodes. Because of the shadowing of the bottom oxide by the electrode, catalyst deposition can readily be avoided between electrodes by shallow-angle evaporation. Adjacent to the electrodes, however, the oxide surface is exposed to the incoming beam of catalyst atoms. Even though Si does not normally deposit on the oxide because the added HCl makes the process selective with clean oxide, the catalyst deposited on the oxide accelerates decomposition of $SiH_4$, leading to spurious deposition on the oxide adjacent to the electrodes and providing a path for leakage current between electrodes. Therefore, deposition of the catalyst on the exposed oxide must be avoided, or the catalyst must be selectively removed from these regions before nanowire growth. Because of the different amount of catalyst deposited on horizontal and vertical surfaces and the different behavior on silicon and on oxide during annealing, the catalyst can be removed selectively by careful and optimized annealing and etching.

For use in an electronic device, adding dopant atoms to the nanowires may be necessary. For thicker, gold-catalyzed nanowires, boron can be incorporated into the nanowires during growth by adding the p-type dopant diborane $B_2H_6$ to the $H_2/SiH_4/HCl$ ambient in the deposition chamber. Current-voltage measurements between two electrodes indicate that the boron dopant concentration increases with increasing $B_2H_6$ partial pressure in the deposition ambient. These electrical measurements and the dimensions of the nanowires indicate that boron concentrations in the low $10^{18}$ cm$^{-3}$ range were incorporated into the nanowires. This concentration is of the same magnitude as that found for epitaxial silicon deposition on a plane silicon surface, indicating that doping thicker nanowires is feasible and that the current is not limited by contact resistance between the p-type nanowires and the p-type electrodes. The current-voltage characteristic is linear, suggesting that the nanowires make good electrical contact to the electrodes during growth. FIG. 11 shows the linear current-voltage characteristic between an electrode pair connected by six bridging nanowires.

Doping thinner nanowires is expected to be more complex because of the closer proximity to the surface and the statistically small number of dopant atoms that would be incorporated into a nanowire a few nanometers in diameter. The dopant atoms may segregate to the surface of the nanowire, or the number of dopant atoms might be so small that a fluctuating potential might impede current flow. Omitting the dopant atoms during growth and adding dopant (if needed) from the surface after growth may provide more robust process control.

For either sensor or field-effect-transistor applications, the conductance of the nanowires must be modulated effectively. The programming capability allows adjusting the dopant concentration within the interior of the nanowire to improve the sensitivity of the sensor or the threshold voltage and the transconductance of the transistor. When used as a depletion-mode FET, the entire cross section of the nanowire must be depleted. When used as a sensor, the sensitivity can be increased if the conducting region is narrow. Therefore, the maximum thickness of the depletion region can limit the range of useful combinations of doping and diameter. Because the amount of charge that must be depleted to extend the depletion region further decreases as the depletion region extends into the nanowire, the maximum depletion-region thickness is greater for a nanowire than for a plane surface. From a one-dimensional analysis in radial coordinates using the complete-depletion approximation, the maximum thickness of the depletion region is given by the common formula for $X_{dmax}$ of a plane structure multiplied by a geometrical factor of between 1 and 2. For a nanowire diameter of 20 nm, the maximum dopant concentration that allows complete depletion is in the mid $10^{19}$ cm$^{-3}$ range. For somewhat thinner nanowires, the maximum dopant concentration is limited by the solid solubility of the dopant in Si. For narrow nanowires, quantum effects may also modify the electrical behavior.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A nanowire comprising:
    a single crystalline semiconductor material having an exterior surface and an interior region; and
    one or more dopant atoms,
    wherein at least a portion of the nanowire thermally switches between two conductance states, the two conductance states being a high conductance state and a low conductance state, and
    wherein in the high conductance state, a first fraction of the dopant atoms are in the interior region and a second fraction of the dopant atoms are at the exterior surface, and wherein in the low conductance state, a third fraction of the dopant atoms are in the interior region and a fourth fraction of the dopant atoms are at the exterior surface, the first fraction being greater than the third fraction and the second fraction being less than the fourth fraction.

2. The nanowire of claim 1, wherein the first fraction corresponds to a concentration of $10^{19}$ cm$^{-3}$ to $10^{20}$ cm$^{-3}$ and the third fraction corresponds to a concentration of $10^{16}$ cm$^{-3}$ to $10^{17}$ cm$^{-3}$.

3. The nanowire of claim 1, wherein the single crystalline semiconductor material is an elemental semiconductor.

4. The nanowire of claim 1, wherein the single crystalline semiconductor material is selected from the group consisting of Si, Ge, InP, or GaAs.

5. The nanowire of claim 1, wherein the dopant atom is an n-type dopant selected from the group consisting of phosphorus, arsenic, antimony and bismuth.

6. The nanowire of claim 1, wherein a diameter of the nanowire is less than 0.1 microns.

7. The nanowire of claim 6, wherein the diameter is from 5 to 50 nm.

8. A circuit, comprising:
    the nanowire of claim 1 electrically connected between two electrical contact points within the circuit;
    means for raising and lowering a temperature of at least a portion of the nanowire to switch at least the portion of the nanowire between two conductance states, the two conductance states being a high conductance state and a low conductance state.

9. The circuit of claim 8, wherein means of raising and lowering the temperature passes a current through the nanowire.

10. The circuit of claim 8, comprising:
    a second nanowire positioned in the circuit at an angle to a first nanowire and approaching the first nanowire at an interaction point,
    wherein means of raising and lowering the temperature passes a current through the second nanowire to raise a temperature of the first nanowire at the interaction point.

11. The circuit of claim 8, wherein means of raising and lowering the temperature repeatedly raises and lowers the temperature to repeatedly switch at least the portion of the nanowire between the two conductance states.

12. A method to select conductance of the nanowire of claim 1 formed of a single crystalline semiconductor material, the method comprising:
    increasing a temperature of the nanowire at least in a local region to a programming temperature to thermally activate diffusion of the dopant atoms in the local region; and
    decreasing the temperature of the nanowire at least in the local region to a second temperature to immobilize dopant atoms in the local region, the second temperature being below the programming temperature,
    wherein increasing the temperature and decreasing the temperature thermally switches the nanowire between two conductance states, the two conductance states including the high conductance state and the low conductance state.

13. The method of claim 12, comprising:
    electrically connecting two electrical contact points within a circuit with the nanowire.

14. The method of claim 13, wherein the electrically connecting occurs during forming of the nanowire by a metal catalyzed CVD technique.

15. The method of claim 12, wherein the programming temperature is at or above about 800° C.

16. The method of claim 15, wherein the second temperature is from room temperature to about 100° C.

17. The method of claim 16, wherein decreasing the temperature of the nanowire at least in the local region to less than 500° C. is at a rate of at least $10^5$ degrees/sec.

18. The method of claim 12, wherein increasing the temperature is by resistive heating of the nanowire by passing a current through the nanowire.

19. The method of claim 12, wherein decreasing the temperature is by ambient cooling of the nanowire.

20. The method of claim 12, comprising:
repeating the steps of increasing the temperature and decreasing the temperature to repeatedly select the conductance of the nanowire.

21. The method of claim 12, comprising;
increasing the temperature of the programmed nanowire to a temperature intermediate the second temperature and the programming temperature to change the selected conductance of the nanowire.

22. A method to configure a circuit comprising a plurality of electrical paths formed of a plurality of nanowires according to claim 1, the method comprising:
selecting a first conductance of one or more nanowires in a first electrical path of the circuit; and
changing the first conductance of the one or more nanowires in the first electrical path.

23. The method of claim 22, wherein the first fraction is a conductive effective amount of dopant atoms and the second fraction is a resistive effective amount of dopant atoms.

24. The method of claim 22, comprising:
selecting a second conductance of one or more nanowires in a second electrical path of the circuit; and
changing the second conductance of the one or more nanowires in the second electrical path.

25. The method of claim 22, comprising repeating the selecting and changing.

26. The method of claim 22, wherein the circuit includes an operating algorithm for an electronic device.

* * * * *